United States Patent [19]

Yamamoto et al.

[11] Patent Number: 5,616,181
[45] Date of Patent: Apr. 1, 1997

[54] MBE APPARATUS AND GAS BRANCH PIPING APPARATUS

[75] Inventors: Yoshitsugu Yamamoto; Kaoru Kadoiwa, both of Tokyo, Japan

[73] Assignee: Mitsubishi Denki Kabushiki Kaisha, Tokyo, Japan

[21] Appl. No.: 561,455

[22] Filed: Nov. 21, 1995

[30] Foreign Application Priority Data

Nov. 24, 1994 [JP] Japan ..................................... 6-289495

[51] Int. Cl.⁶ ............................................ C23C 16/00
[52] U.S. Cl. ............................ 118/723 ER; 118/723 MP; 118/692
[58] Field of Search ......................... 118/723 ER, 723 E, 118/723 MP, 716, 717, 723 FE, 723 FI, 692; 156/345, 626.1, 627.1; 204/298.33, 298.07

[56] References Cited

U.S. PATENT DOCUMENTS

| | | | |
|---|---|---|---|
| 4,138,306 | 2/1979 | Niwa | 156/345 |
| 4,522,647 | 6/1985 | Ninomiya et al. | 156/345 |
| 4,849,249 | 7/1989 | Ishihara et al. | 427/38 |
| 4,867,859 | 9/1989 | Harada et al. | 204/298 |
| 5,010,842 | 4/1991 | Oda et al. | 118/723 |
| 5,203,958 | 4/1993 | Arai et al. | 156/643 |
| 5,383,984 | 1/1995 | Shimada et al. | 156/345 |

FOREIGN PATENT DOCUMENTS 0052013  3/1985  Japan ................. 118/723 ER

*Primary Examiner*—R. Bruce Breneman
*Assistant Examiner*—Joni Y. Chang
*Attorney, Agent, or Firm*—Leydig, Voit & Mayer

[57] ABSTRACT

An MBE apparatus includes a reaction chamber in which a molecular beam of a gas irradiates a substrate for crystal growth; a gas bomb containing the gas; a regulator for reducing the pressure of the gas from the gas bomb; a pressure control apparatus having one or more anode and cathode electrodes, a coil for generating a magnetic field applied to the supplied gas, and a controller for controlling the electric field between the anode and cathode electrodes, the area of the anode and cathode electrodes, and the magnetic field generated by the coil, so that a molecular beam irradiates the substrate with the gas supplied. The supply of the gas may be quickly varied with high reproducibility and high precision. In addition, a semiconductor layer having a uniform carrier concentration can be easily formed on the semiconductor substrate or a semiconductor layer having a uniform composition ratio can be easily formed on the semiconductor substrate.

8 Claims, 7 Drawing Sheets

MBE APPARATUS AND GAS BRANCH PIPING APPARATUS

FIELD OF THE INVENTION

The present invention relates to an MBE apparatus utilizing a pressure control apparatus which can quickly and accurately control the flow rate of a material source gas in a dopant source gas being supplied under a very low pressure, as a flow rate control apparatus.

The present invention also relates to a gas branch piping apparatus utilizing a pressure control apparatus which can interrupt a gas flow quickly by its exhaust function as a gas branching means.

BACKGROUND OF THE INVENTION

In fabricating a semiconductor device, a method of introducing a substrate with a gas into a reaction chamber under high vacuum and irradiating the gas as a molecular beam in the reaction chamber is widely applied as a method of producing a high reaction efficiency. When controlling the reaction, since the gas is supplied in a molecular beam, it is necessary to control the pressure of the supply gas accurately at a very low pressure less than $10^{-5}$ Torr. In the prior art, a mass flow controller, a leak valve, or the like are used for this control. Pressure control systems utilizing a mass flow controller and a leak valve, respectively, are illustrated in FIGS. 11 and 12, respectively.

In FIG. 11, reference numeral 1 designates a reaction chamber, reference numeral 2 designates a mass flow controller, reference numeral 3 designates material gas, and reference numeral 4 designates a substrate. In the first prior art example, the pressure of the material source gas introduced into the reaction chamber 1 is controlled by the mass flow controller 2. However, since the limit of flow rate controllability of a mass flow controller is generally around 1 SCCM, the pressure of the material source gas introduced into the reaction chamber 1 can be reduced only to a pressure of about $10^{-5}$ Torr in the mass flow controller 2. Therefore, the mass flow controller is not applicable to an MBE apparatus which is required to be used at a pressure of $10^{-8} \sim 10^{-10}$ Torr.

FIG. 12 shows a system utilizing a control leak valve. In FIG. 12, reference numeral 5 designates a pressure gauge, reference numeral 6 designates a control leak valve for low pressure control which adjusts the aperture of the valve based on the pressure that is measured with the pressure gauge 5. In the second prior art example, since pressure control is performed by aperture adjustment with a vernier of the control leak valve 6, its controllability depends on the machined precision of an orifice and a vernier. Therefore, when very low pressure control is to be performed, an extreme machine precision is required, and reproducibility and durability are not satisfactory.

In a gas branch piping which changes a gas passage, a valve is conventionally used as a gas branching means. However, since changing of a gas passage by the valve is carried out by mechanical control, when the gas passage is changed quite often, controllability and durability are not satisfactory.

Since the prior art MBE apparatus utilizes the apparatus described above as flow rate control apparatus, precision, reproducibility, and durability of the flow rate control apparatus are not satisfactory.

Furthermore, since the prior art gas branch piping apparatus utilizes valves as a gas branching means, when the gas passage is changed quite often, controllability and durability of the gas branching means are not satisfactory.

SUMMARY OF THE INVENTION

It is an object of the present invention to provide an MBE apparatus that quickly and accurately controls the quantity of dopant source gas or material source gas which is supplied to the reaction chamber with high reproducibility.

It is another object of the present invention to provide a gas branch piping apparatus that can accurately and quickly control the gas flowing direction with high durability.

Other objects and advantages of the invention will become apparent from the detailed description that follows. The detailed description and specific embodiments described are provided only for illustration since various additions and modifications within the scope of the invention will be apparent to those of skill in the art from this detailed description.

According to a first aspect of the present invention, an MBE apparatus for growing crystal by molecular beam epitaxy includes a reaction chamber in which a molecular beam of a material gas or a dopant source gas is irradiated onto a substrate and a crystal growth is performed thereon, a gas bomb containing the material gas or the dopant source gas, a regulator for reducing the pressure of the material gas or the dopant source gas from the gas bomb, a pressure control apparatus having a singular or plural anode and cathode electrodes in which an electric field is applied to gas supplied to the apparatus, a coil generating a magnetic field applied to the supplied gas, and a controller controlling any of the electric field between the anode electrode and the cathode electrode, the areas of the anode electrode and the cathode electrode, and the magnetic field generated by the coil, and controlling the pressure of gas supplied from the regulator to the apparatus to a desired pressure, and a molecular beam cell provided in the reaction chamber and making gas supplied from the pressure control apparatus to the reaction chamber in a state of molecular beam and irradiating the supplied gas to the substrate. Therefore, the supply quantity of the material gas or the dopant source gas is quickly varied with high reproducibility and high precision. In addition, the semiconductor layer having an uniform carrier concentration can be easily formed on the semiconductor substrate, or the semiconductor layer having an uniform composition ratio can be easily formed on the semiconductor substrate.

According to a second aspect of the present invention, in the MBE apparatus, the molecular beam cell is directly connected to the output of the regulator, and the pressure control apparatus is connected to an nozzle of the molecular beam cell exhausting the molecular beam, thereby further improving the controllability.

According to a third aspect of the present invention, in the MBE apparatus, a plurality of pressure control apparatus are connected in series, whereby the dopant source gas or the material gas is quickly intercepted, and the undoped layer can be easily formed on the semiconductor substrate, or the semiconductor layer having a different material can be easily formed on the semiconductor substrate.

According to a fourth aspect of the present invention, an MBE apparatus for growing crystal by molecular beam epitaxy includes a reaction chamber in which a molecular beam of a material gas or a dopant source gas is irradiated onto a plurality of substrates and a crystal growth is performed thereon, a gas bomb containing the material gas or the dopant source gas, a regulator for reducing the pressure of the material gas or the dopant source gas from the gas bomb, a plurality of pressure control apparatus arranged in parallel and each having a singular or plural anode and cathode electrodes in which an electric field is applied to gas supplied to the apparatus, a coil generating a magnetic field applied to the supplied gas, and a controller controlling any of the electric field between the anode electrode and the cathode electrode, the areas of the anode electrode and the cathode electrode, and the magnetic field generated by the coil, and controlling the pressure of gas supplied from the regulator to each apparatus to a desired pressure, and a plurality of molecular beam cells provided in the reaction chamber and making gas supplied from the respective pressure control apparatus to the reaction chamber in a state of molecular beam and irradiating the supplied gas to the substrates, respectively. Therefore, the supply quantity of the material gas or the dopant source gas is quickly varied with high reproducibility and high precision. In addition, a plurality of semiconductor layers each having a different doping quantity can be simultaneously and easily formed on the semiconductor substrate, or the semiconductor layer having a different construction ratio of material can be simultaneously and easily formed on the semiconductor substrate.

According to a fifth aspect of the present invention, in the MBE apparatus, a plurality of molecular beam cells are directly connected to the output of the regulator in parallel to each other, and each pressure control apparatus is connected to each nozzle of each molecular beam cell exhausting the molecular beams, thereby further improving the controllability.

According to a sixth aspect of the present invention, in the MBE apparatus, a plurality of pressure control apparatus are arranged in series to each other, whereby the dopant source gas or the material gas is quickly and accurately intercepted, and the undoped layer can be easily formed on the semiconductor substrate, or the semiconductor layer having a different construction ratio of material can be easily formed on the semiconductor substrate.

According to a seventh aspect of the preset invention, in the MBE apparatus, a plurality of pressure control apparatus are arranged in parallel to each other, whereby the apparatus can be applied in the present invention even though the material gas or the dopant source gas from the gas bomb has a higher flow rate.

According to an eighth aspect of the present invention, a gas branch piping apparatus in which a plurality of branch pipings are connected to a piping wherein a plurality of pressure control apparatus each having an anode electrode and a cathode electrode for applying an electric field to the gas flowing through the branch piping, a coil generating a magnetic field applied to the gas flowing through the branch piping, and a controller controlling any of the electric field between the anode electrode and the cathode electrode, the areas of the anode electrode and the cathode electrode, and the magnetic field generated by the coil, are respectively provided with each of the plurality of branch pipings, whereby the gas flowing direction can quickly and accurately be controlled.

DETAILED DESCRIPTION OF THE PREFERRED EMBODIMENTS

Embodiment 1

Figure 1:
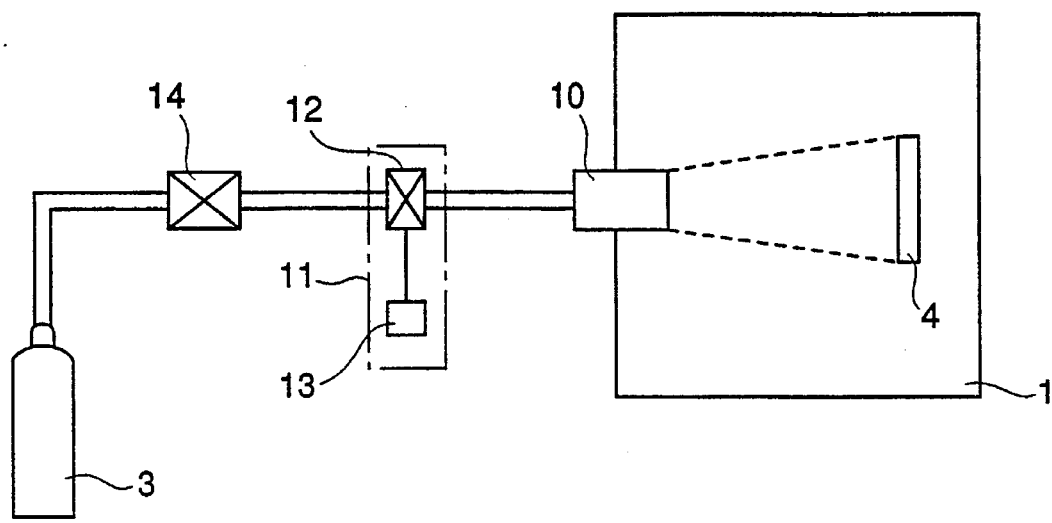
FIG. 1 is a schematic diagram of an MBE apparatus according to a first embodiment of the present invention.

FIG. 1 is a schematic diagram illustrating an MBE apparatus according to a first embodiment of the present invention. In this first embodiment, when a semiconductor layer is grown on a substrate while being doped with an impurity by MBE, the flow rate of dopant source gas is controlled by using a pressure control apparatus. In FIG. 1, reference numeral 1 designates a reaction chamber in which a substrate is contained and a molecular beam of material source gas irradiates the substrate to grow a crystal. A substrate 4 is contained in the reaction chamber 1 and a semiconductor crystal grown thereon by molecular beam irradiation. A gas bomb 3 containing the material source gas is provided. A regulator 14 is provided on the pipe supplying the material gas from the gas bomb 3 for reducing the pressure of the material gas. An ion pump pressure control apparatus 11 is provided on the pipe supplying the material source gas from the gas bomb 3 at a position beyond the regulator 14 for controlling the pressure of the material source gas to a desired pressure (hereinafter, referred to as pressure control apparatus). A pressure control part 12 is provided on the pipe supplying the material source gas in the pressure control apparatus 11. A controller 13 controlling an electrode area, a magnetic field, and an electric field is included in the pressure control apparatus 11. A molecular beam cell 10 is installed in the reaction chamber 1 to convert the gas which is supplied from the pressure control apparatus 11 to the reaction chamber 1 to a molecular beam for irradiating the substrate 4.

Figure 2:
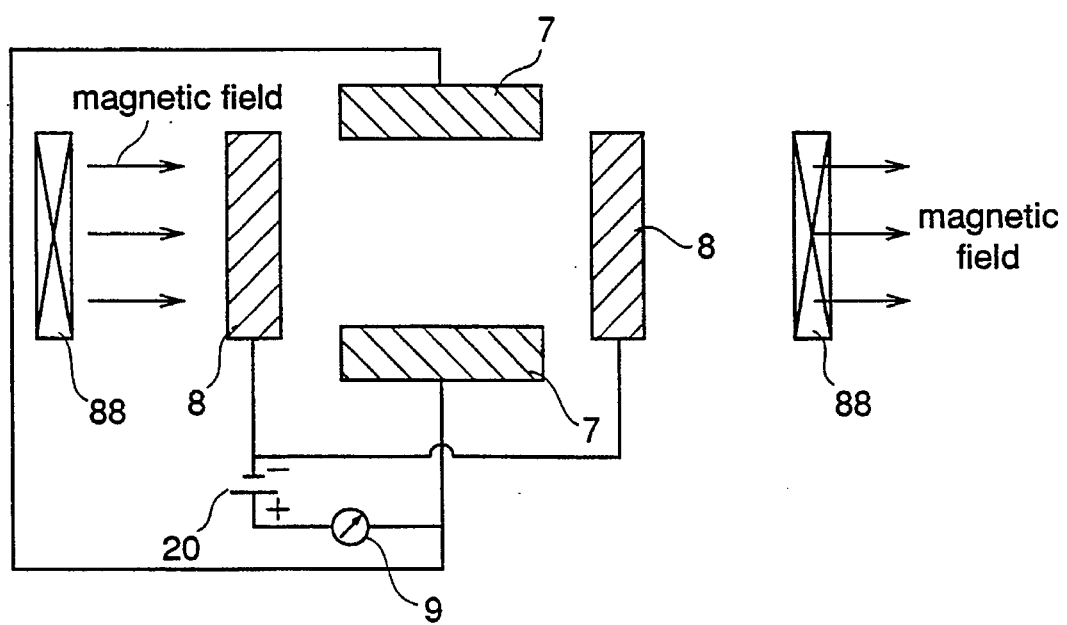
FIG. 2 is a schematic diagram of a pressure control apparatus according to the present invention.

FIG. 2 is a schematic diagram illustrating the pressure control part 12 of the pressure control apparatus 11. In FIG. 2, reference numerals 7 and 8 designate anode electrodes and cathode electrodes, respectively, for applying an electric field to the gas supplied to the pressure control part 12. Reference numeral 9 designates an ampere meter for monitoring a current flowing between the node electrode 7 and the cathode electrode 8. Reference numeral 20 designates a high voltage power source for connected across the anode electrode 7 and the cathode electrode 8 to generate an electric field. Reference numeral 88 designates a coil for generating a magnetic field applied to the supplied gas (hereinafter, referred to as a coil).

A description is given of an operation with reference to an example in which GaAs is grown on the substrate 4 while doped with C, using $CBr_4$ as dopant source gas.

The $CBr_4$ gas introduced from the gas bomb 3 is reduced in its pressure to a controllable pressure of the pressure control apparatus 11 by the regulator 14 and introduced into the pressure control part 12 of the pressure control apparatus 11. A part of the introduced $CBr_4$ gas is ionized by a cold cathode discharge that occurs between the anode electrode 7 and the cathode electrode 8 in the magnetic field generated by the coil 88 in the pressure control part 12, resulting in $C^+$ and $Br^+$. Since these ions have positive charges, they are absorbed onto the cathode electrode 8, whereby the $CBr_4$ gas is discharged. The quantity of discharged gas can be set at a desired value by controlling the electrode area which is determined by adjusting the number of a plurality of anode electrodes 7 and cathode electrodes 8 to be used, the magnetic field Generated by the coil 88, or the electric field produced by the high voltage power supply 20. Here, the quantity the $CBr_4$ gas which is not discharged but output from the pressure control part 12 determines the gas pressure of about $10^{-3} \sim 10^{-5}$ Torr, at the exit of the pressure control part 12. The $CBr_4$ gas having a flow rate that is determined by the difference between that gas pressure and the gas pressure in the reaction chamber 1, about $10^{-8}$ Torr, is introduced into the reaction chamber 1 through the molecular beam cell 10 installed in the reaction chamber 1. The $CBr_4$ gas becomes a molecular beam in the molecular beam cell 10 and irradiates the GaAs substrate inside the reaction chamber 1.

Figure 3:
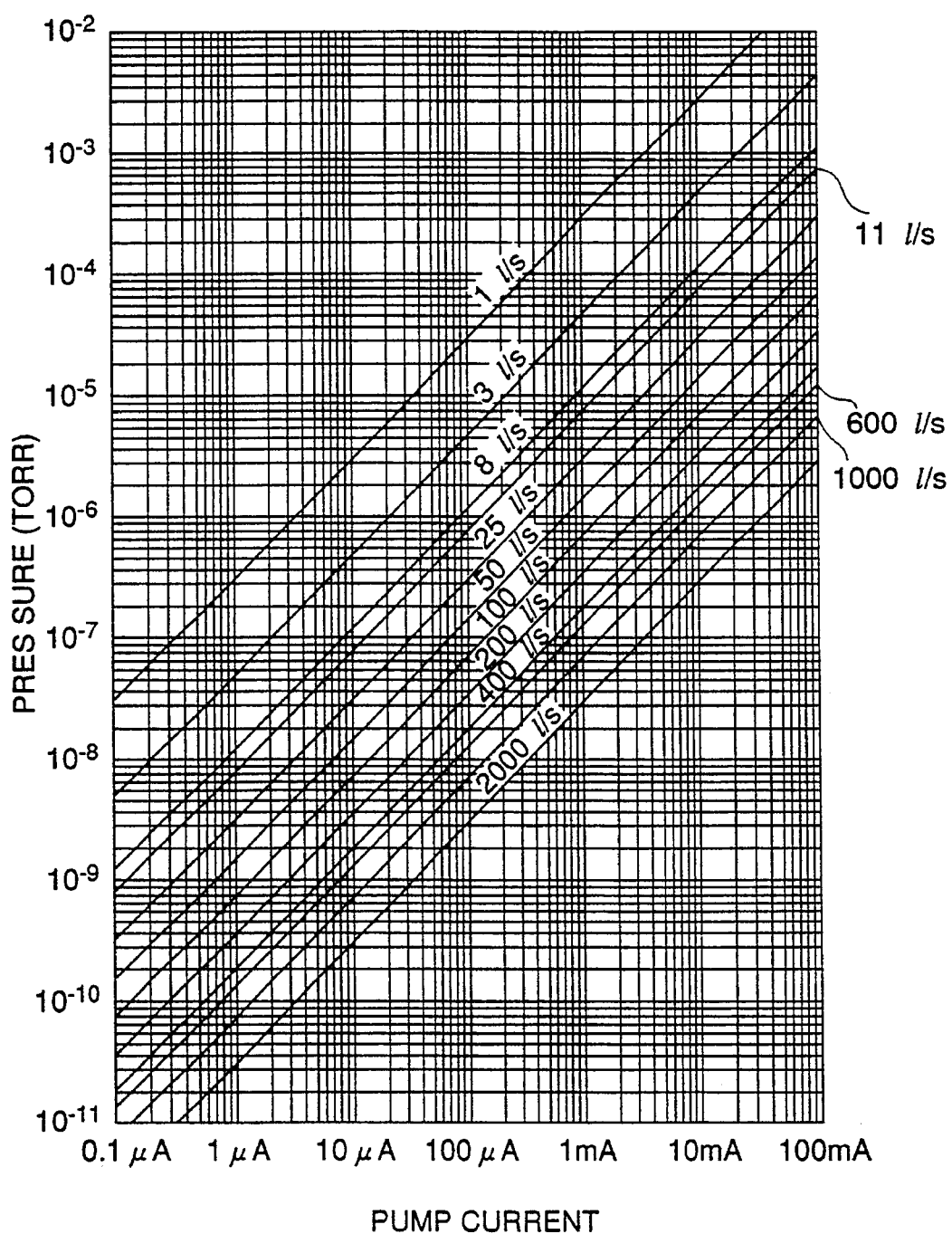
FIG. 3 is a graph illustrating a relationship between gas pressure at the exit of the pressure control apparatus and current between the anode and cathode of this pressure control apparatus, in the MBE apparatus according to the first embodiment of the present invention.

FIG. 3 shows a graph illustrating a relationship between the gas pressure at the exit of the pressure control part 12 and the current flowing between the anode 7 and the cathode 8, with the exhaust gas flow of the pressure control apparatus 11 varied as a parameter. As apparent from FIG. 3, the gas pressure at the exit of the pressure control part 12 can be controlled by adjusting the current flowing between the anode 7 and the cathode 8 and, therefore, it is not necessary to provide another pressure gauge at the exit. Further, when the pressure control apparatus 11 is operated, since the cathode electrode 8 usually comprises Ti and the surface of the Ti electrode is always cleaned by sputtering during the adsorption of $C^+$ and $Br^+$, the exhaust capacitance of the pressure control apparatus 11 does not change with operation time, resulting in no error in its operation. Therefore, the flow rate of the material source gas introduced into the reaction chamber 1 can easily and accurately be controlled solely by controlling the current flowing between the anode 7 and the cathode 8 of the pressure control apparatus 11.

Figure 4:
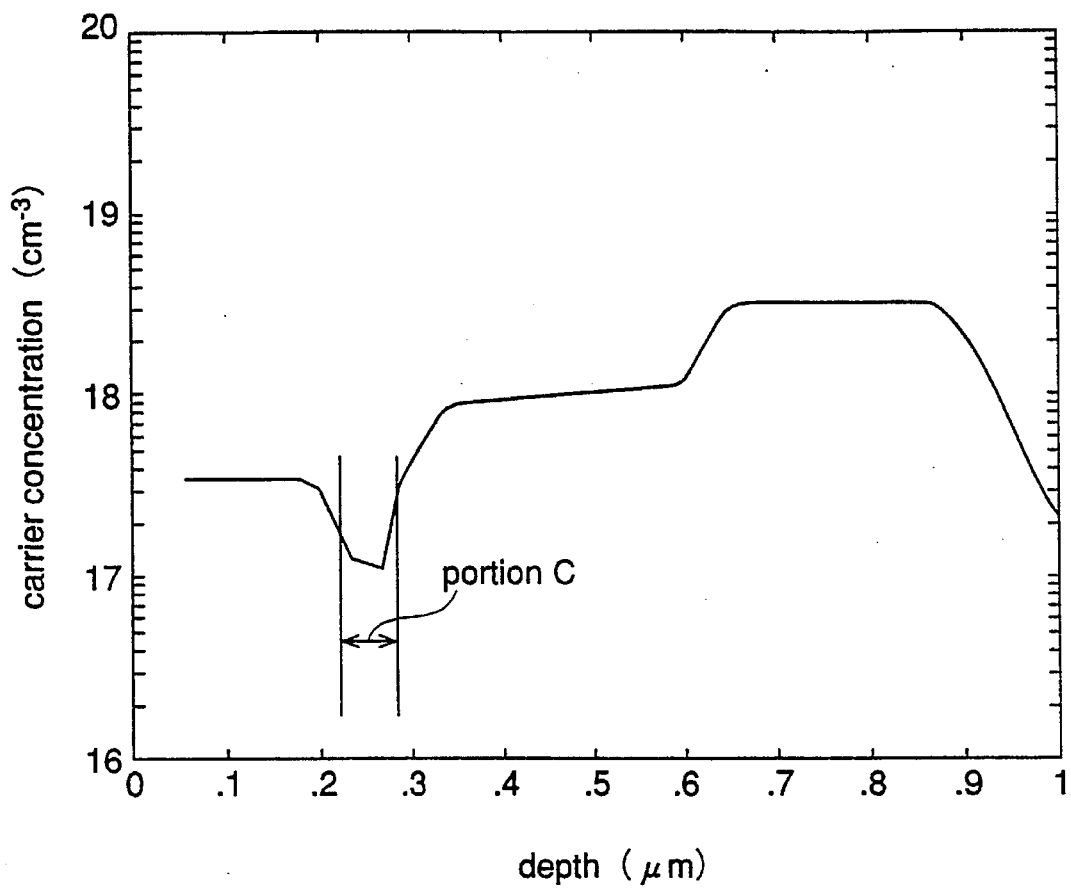
FIG. 4 is a graph illustrating the result of measurement by the C-V method of carrier concentration within C-doped GaAs fabricated using $CBr_4$ as a dopant source.

FIG. 4 shows a profile of the carrier concentration of a GaAs layer in the depth direction. The GaAs layer is grown in the MBE apparatus according to the first embodiment, and the profile is measured by a C-V method. In FIG. 4, the portion C is a portion where the pressure control apparatus 12 is operated. It can be found that a preferable control of carrier concentration is conducted in this portion.

In the MBE apparatus according to the first embodiment, since the pressure control apparatus 11 is used as an apparatus for controlling the flow rate of the material gas, the gas pressure of the material gas at the exit of the pressure control part 12 can be monitored solely by monitoring the current flowing between the anode 7 and the cathode 8. Therefore, by adjusting the electrode area, the magnetic field, and the electric field based on the monitored gas pressure, the rate of supply of the material source gas into the reaction chamber 1 can accurately and quickly be changed, and the GaAs layer having a desired carrier concentration can easily be formed on the substrate. Furthermore, since the pressure control apparatus 12 has no mechanical control mechanism, the durability of the MBE apparatus can be improved.

Embodiment 2

Figure 5:
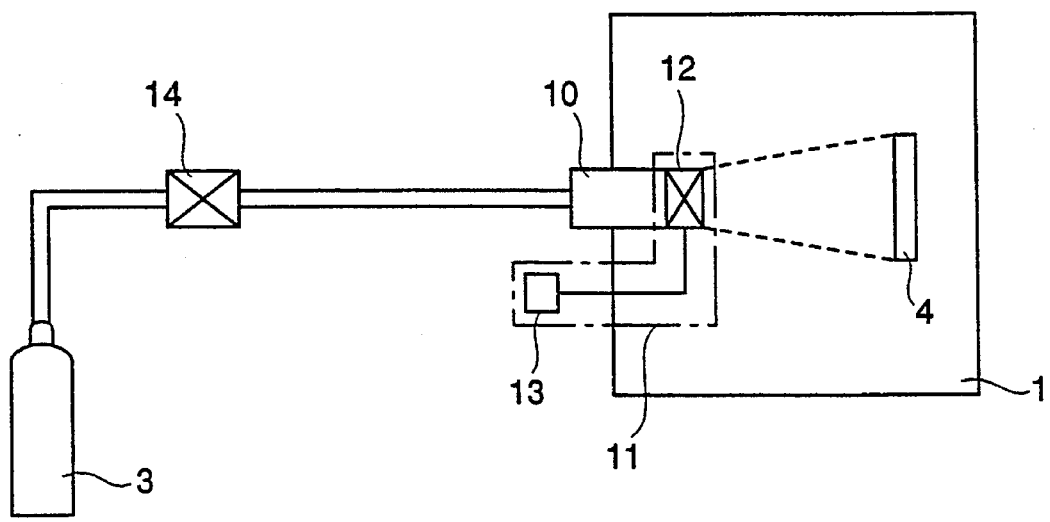
FIG. 5 is a schematic diagram of an MBE apparatus according to a second embodiment of the present invention.

FIG. 5 is a schematic diagram illustrating an MBE apparatus according to a second embodiment of the present invention. In the second embodiment, the output of the regulator 14 is directly connected to the molecular beam cell 10 in the reaction chamber 1, and the pressure control apparatus 11 is installed at the nozzle of the molecular beam cell 10 in the first embodiment.

Since, in the first embodiment, the pressure control apparatus 11 is provided in front of the molecular beam cell 10, residual gas between the pressure control part 12 and the molecular beam cell 10 cannot be controlled, even if the pressure control apparatus 11 is operated, thereby providing a time lag. However, since, in the second embodiment, the MBE apparatus has the described construction, there is no time lag due to the residual gas as in the first embodiment and the supply of the $CBr_4$ gas can be controlled more quickly with high controllability. Further, since the pressure control apparatus 11 does not particularly use a mechanical control, the apparatus 11 can be provided at the nozzle of the molecular beam cell 10 installed in the reaction chamber 1 which is in a vacuum state and can easily be controlled.

In the MBE apparatus according to the second embodiment, a GaAs layer for which a doping quantity is more quickly and more accurately varied can easily be formed on the semiconductor substrate.

Embodiment 3

Figure 6:
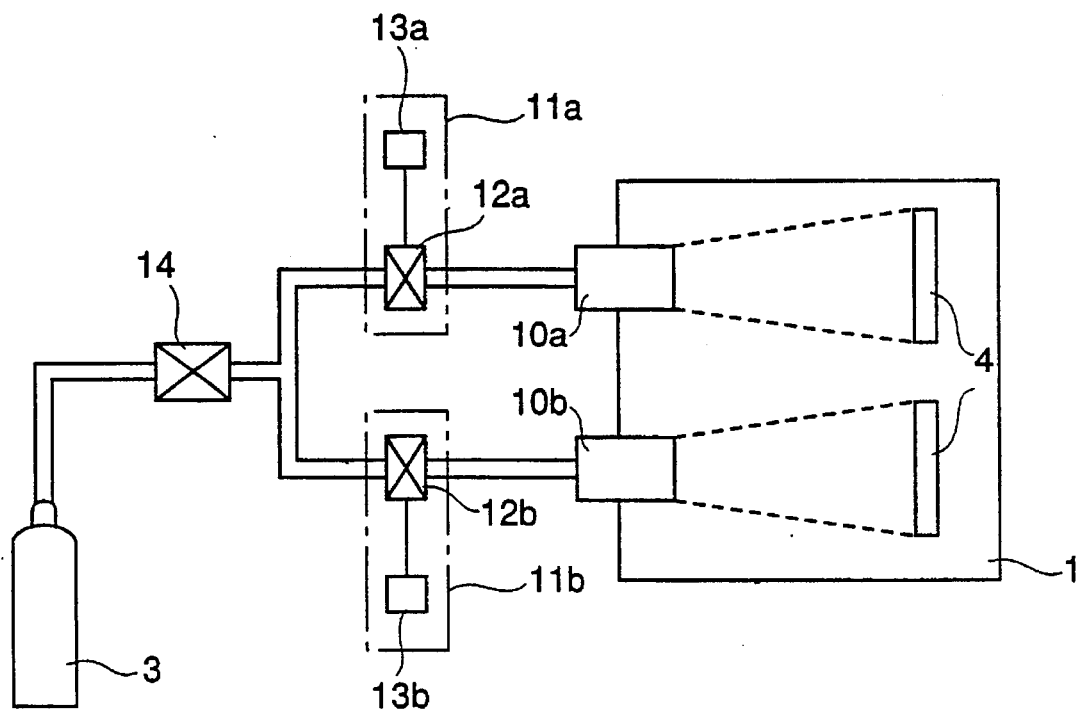
FIG. 6 is a schematic diagram of an MBE apparatus according to a third embodiment of the present invention.

FIG. 6 is a schematic diagram illustrating an MBE apparatus according to a third embodiment of the present invention.

In the MBE apparatus according to the third embodiment, semiconductor layers each having a different doping quantity are simultaneously formed on a plurality of semiconductor substrates 4. A plurality of pressure control apparatus are connected to the regulator 14 and arranged in parallel and provided for the pressure control apparatus 11a and 11b of the molecular beam cells 10a and 10b respectively.

Next, a description is given of an operation with reference to an example in which a GaAs layer is formed while being doped with C, using $CBr_4$ as dopant source gas.

First, the desired exhaust gas quantity is set for each of a plurality of pressure control apparatus 11a and 11b. By setting the exhaust gas quantity, the pressures of the $CBr_4$ gas which is supplied to the pressure control parts 12a and 12b at the exits of the pressure control parts can be made arbitrary different values, respectively. Each supply rate of the $CBr_4$ gas supplied to the reaction chamber 1, which is determined by the difference between the gas pressure at the exit of the pressure control part and the gas pressure inside the reaction chamber, can be made a desired quantity, respectively. That is, GaAs layers having different dopant concentrations can be simultaneously formed on a plurality of substrates.

In the MBE apparatus according to the third embodiment, a plurality of GaAs layers each having a different dopant concentration can simultaneously and easily be formed.

Embodiment 4

Figure 7:
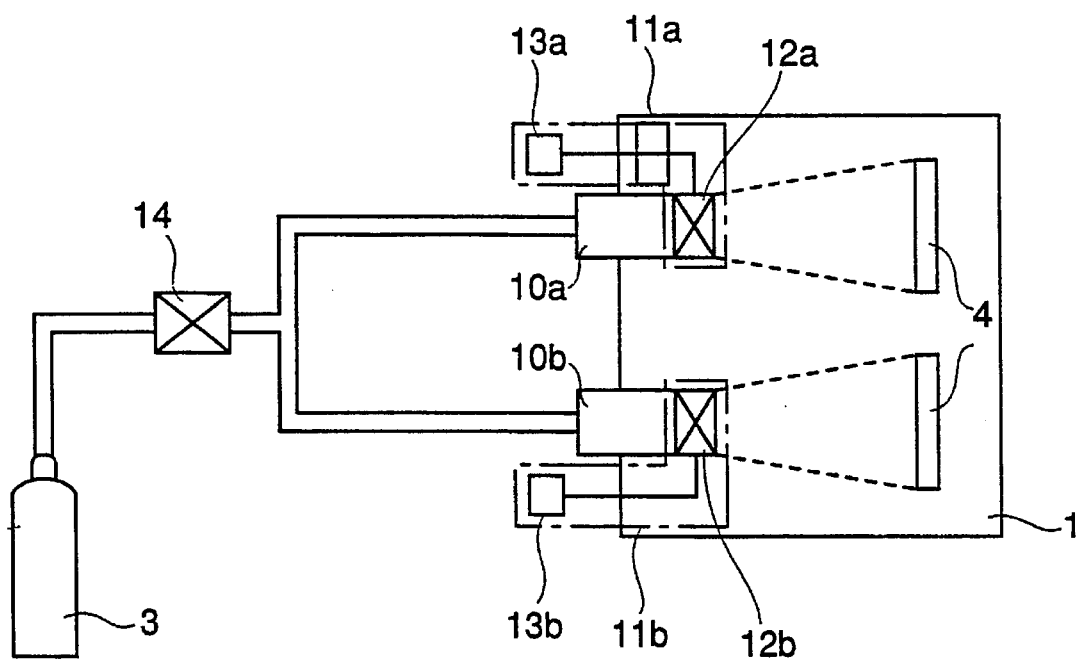
FIG. 7 is a schematic diagram of an MBE apparatus according to a fourth embodiment of the present invention.

FIG. 7 is a schematic diagram illustrating an MBE apparatus according to a fourth embodiment of the present invention. In the fourth embodiment, the outputs of the regulator 14 are respectively directly connected to a plurality of the molecular beam cells 10a and 10b provided in parallel inside the reaction chamber 1. A plurality of pressure control apparatus 11a and 11b are respectively provided at the nozzles of the molecular beam cells 10a and 10b as in the second embodiment.

In the MBE apparatus according to the fourth embodiment, a plurality of semiconductor layers, in which the respective dopant concentrations are varied more quickly and more accurately, can simultaneously and easily be formed on the semiconductor substrates, respectively.

Embodiment 5

Figure 8:
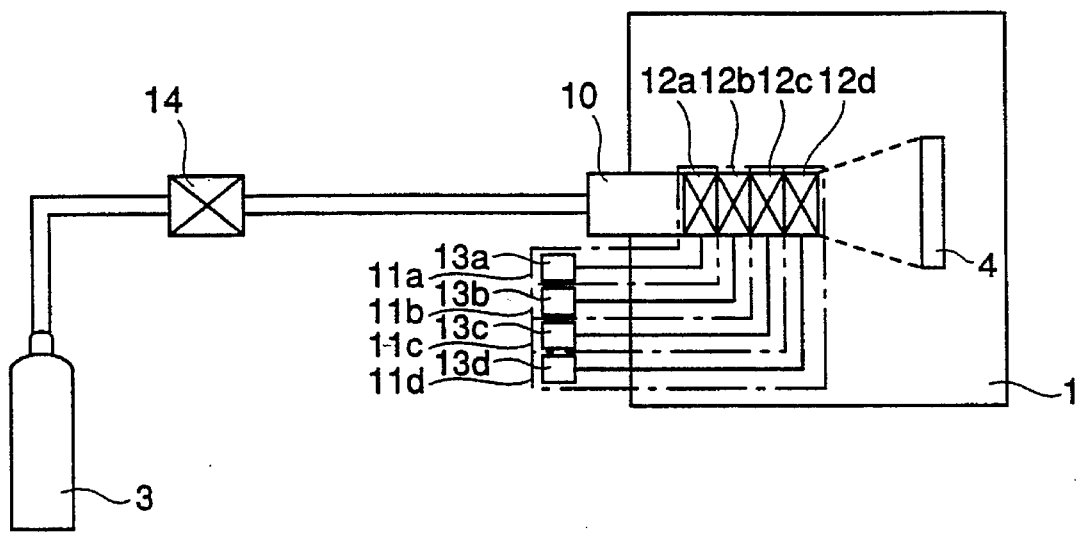
FIG. 8 is a schematic diagram of an MBE apparatus according to a fifth embodiment of the present invention.

FIG. 8 is a schematic diagram illustrating an MBE apparatus according to a fifth embodiment of the present invention. In the fifth embodiment, a plurality of pressure control apparatus 11a to 11d are connected in series, and the MBE apparatus has a shutter function for molecular beam epitaxy using the plurality of pressure control apparatus 11a to 11d.

Next, a description is given of an operation with reference to an example in which a GaAs layer is formed while being doped with C, using $CBr_4$ as dopant source gas, and the pressure of the $CBr_4$ gas which is supplied from the regulator 14 to the molecular beam cell 10 is $10^{-2}$ Torr.

In a pressure control apparatus, the pressure of the gas which is supplied to this apparatus can usually be reduced to +e,fra 1/10²+ee of the pressure when supplied, and output. If, for example, four pressure control apparatus 11a to 11d are connected in series to the nozzle of the molecular beam cell 10, the pressure of the $CBr_4$ gas at the exit of the last pressure control part 12d can be reduced to $10^{-10}$ Torr. Since the pressure inside the reaction chamber is usually around $10^{-8}$~$10^{-10}$ Torr, by controlling the pressure of the four pressure control apparatus 11a to 11d, the pressure difference between the exit of the last pressure control apparatus 11d and the inside reaction chamber can be eliminated whereby the supply of the $CBr_4$ gas to the reaction chamber can be interrupted. Furthermore, since the supply of the gas is interrupted at the nozzle of the molecular beam cell 10, there is no time lag due to residual gas and the $CBr_4$ gas can be quickly interrupted.

Since the MBE apparatus according to the fifth embodiment has the described construction, semiconductor layers including undoped layers for which the doping quantity is more quickly and more accurately varied can easily be formed on the semiconductor substrate.

The construction in this fifth embodiment in which a plurality of pressure control apparatus 11a to 11d are connected in series can be applied to the MBE apparatus described in the fourth embodiment, with the same effect as in this fifth embodiment.

Embodiment 6

Figure 9:
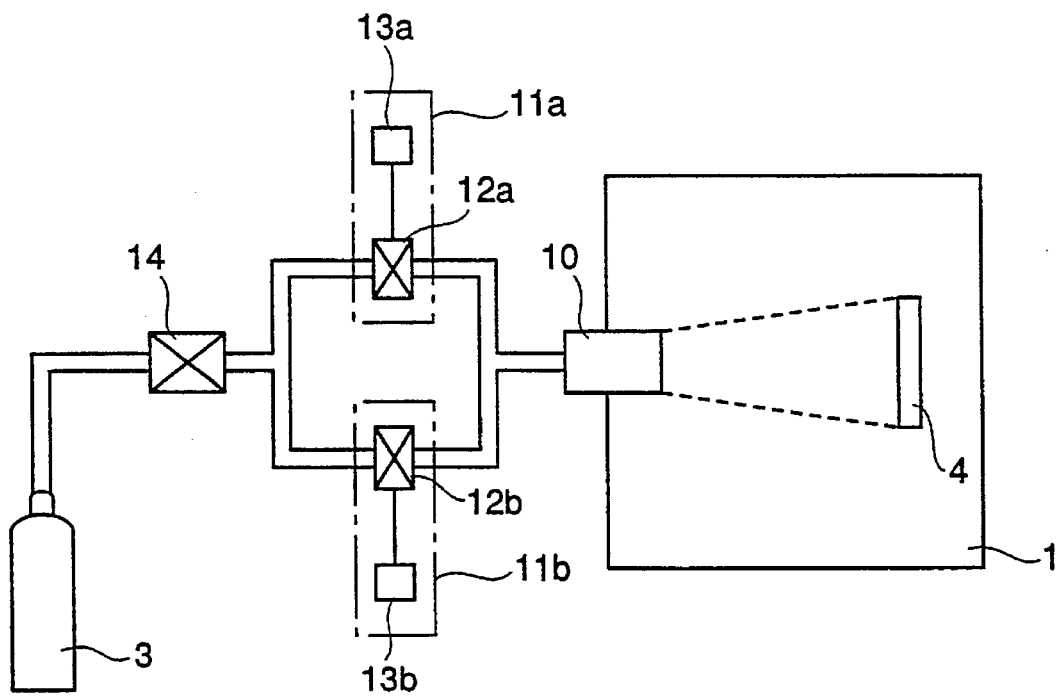
FIG. 9 is a schematic diagram of an MBE apparatus according to a sixth embodiment of the present invention.

FIG. 9 is a schematic diagram illustrating an MBE apparatus according to a sixth embodiment of the present invention. In the sixth embodiment, a plurality of pressure control apparatus are connected in parallel in the and pressure control is possible even at a high gas flow rate.

Since the pressure control apparatus described above controls the pressure of the gas supplied by the exhaust function, if the gas in a quantity exceeding the exhaust capacity is supplied preferable pressure control cannot be achieved. When, as in this sixth embodiment, two pressure control apparatus 11a and 11b are connected in parallel, the sum of the exhaust capacities of each of pressure control apparatus 11a and 11b becomes the total exhaust capacity. If each exhaust capacity of the pressure control apparatus 11a and 11b is the same, in the sixth embodiment a preferable pressure control can be conducted at up to twice the flow rate of the first embodiment.

In this MBE apparatus according to the sixth embodiment, even if the dopant source gas having a higher flow rate is supplied, a preferable pressure control can be achieved, and a semiconductor layer having a larger dopant concentration can easily be formed on the semiconductor substrate.

The construction in this sixth embodiment in which a plurality of pressure control apparatus 11a and 11b are connected in parallel can also be applied to the MBE apparatus described in the third embodiment, with the same effect as in this sixth embodiment.

While, in the MBE apparatus described in the first to the sixth embodiments, the pressure control apparatus 11 is used as an apparatus for controlling the flow rate of the dopant source gas, the pressure control apparatus 11 may be used as an apparatus for controlling the material source gas in a Gas Source Molecular Beam Epitaxy (GSMBE) apparatus, a Metal Organic Molecular Beam Epitaxy (MOMBE) apparatus, and a Chemical Beam Epitaxy (CBE) apparatus, with the same effects as in the described embodiments. In addition, the pressure control apparatus 11 may be a permanent magnet system with the same effects as in the described embodiments. In particular, since the MBE apparatus of the fifth embodiment has a shutter function for molecular beam epitaxy, it is effective in a crystal growth method where switching of materials occurs quite often and a quick switching is required, for example, in the crystal growth method such as Atomic Layer Epitaxy (ALE) in which source materials are supplied for each grown material and layer are grown one atomic layer at a time.

Embodiment 7

Figure 10:
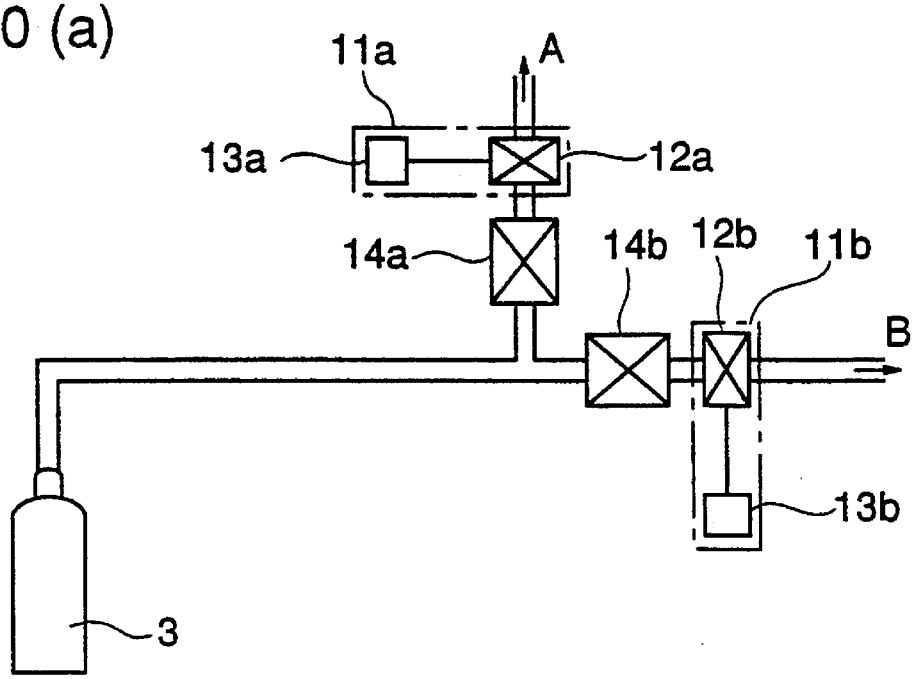
FIGS. 10(a) and 10(b) are schematic diagrams of branch piping apparatus according to a seventh embodiment of the present invention.
Figure 10:
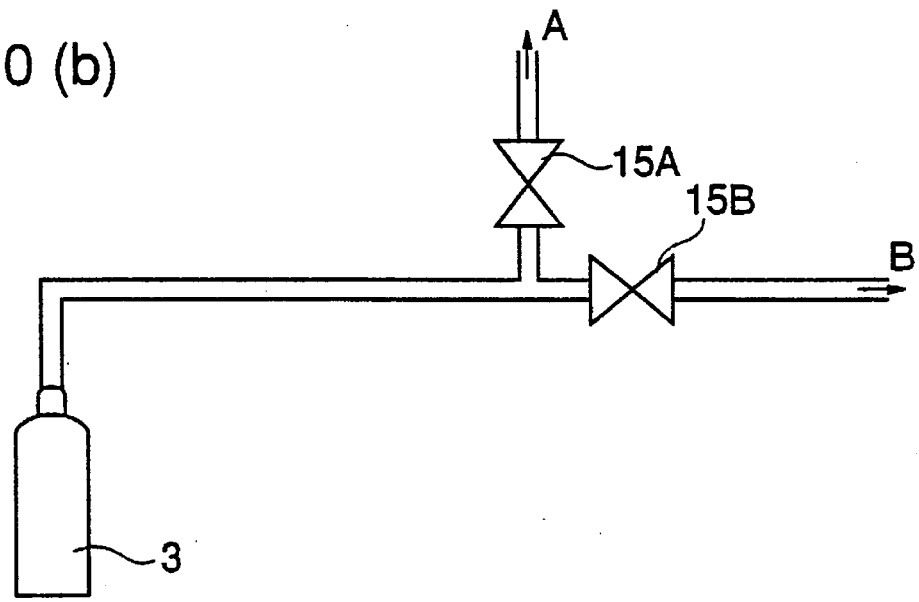
Figure 11:
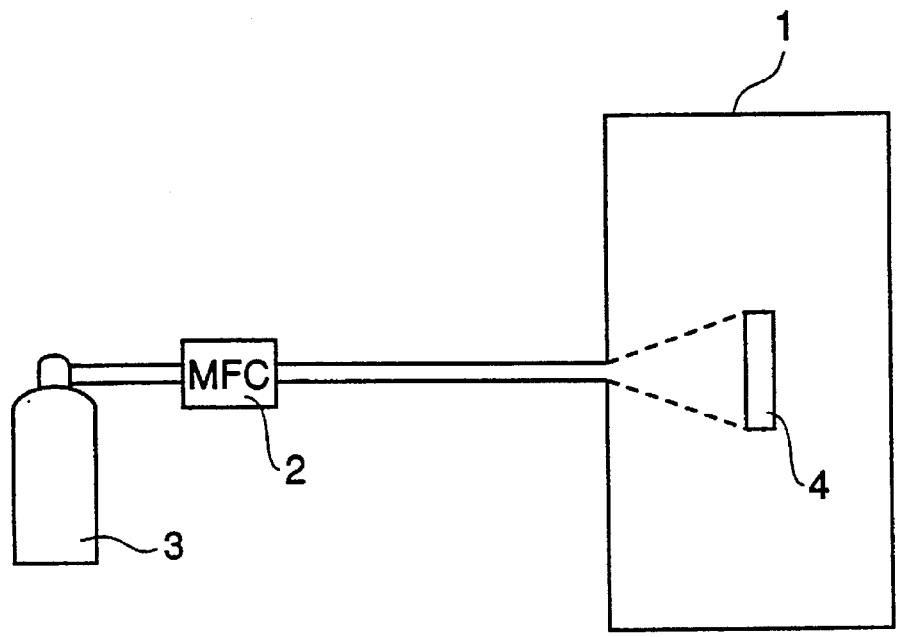
FIG. 11 is a schematic diagram of a pressure control apparatus utilizing a prior art mass flow controller.
Figure 12:
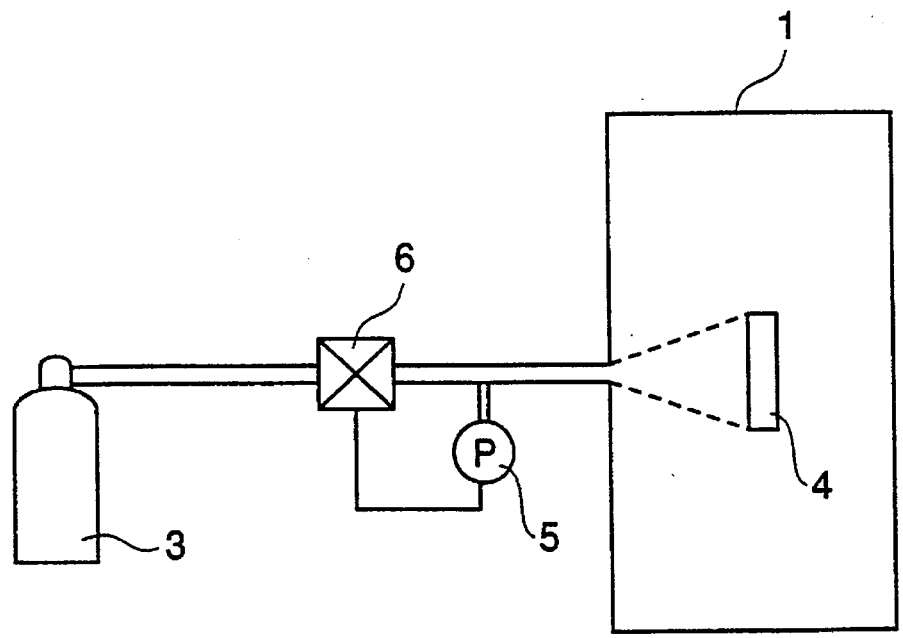
FIG. 12 is a schematic diagram of a pressure control apparatus utilizing a prior art control leak valve.

FIG. 10(a) is a schematic diagram illustrating a gas branch piping apparatus according to a seventh embodiment of the present invention, which apparatus is useful as a gas branch piping when supplying a gas to a high vacuum state.

In the prior art, when the introduced gas, for example the gas which is introduced from the $CBr_4$ gas bomb, is divided into two directions, valves are usually used as gas branching means as shown in FIG. 10(b). Since the gas branching using the valves interrupts the gas passage by mechanical operation, however, high operating speed and durability are not satisfactory. In the seventh embodiment, the pressure control apparatus used in the first to sixth embodiments is used as gas branching means instead of the valves, and gas flowing direction is controlled by the exhaust function to improve operating speed and durability.

A description is given of the operation.

(1) In a case where both A and B directions are interrupted:

Initially, the flow rate of the gas which is introduced from the CBr$_4$ gas bomb to the gas branch piping apparatus is made a flow rate in which the gas can be exhausted by the pressure control apparatus 11a and 11b, for example about 0.01 SCCM, by the regulators 14a and 14b. Thereafter, when the power supplies of the pressure control apparatus 11a and 11b are turned ON, the whole quantity of the CBr$_4$ gas which is supplied to the pressure control parts 12a and 12b in the pressure control apparatus 11a and 11b is ionized to C$^+$ and Br$^+$ in the pressure control parts 12a and 12b, and adsorbed to the cathode electrodes in the pressure control parts and discharged. Here, time period during which the ions are adsorbed to the cathode electrode, i.e., time period during which the gas is discharged, which is determined by the flow rate of the supplied gas and the electrode areas of the anode electrode and the cathode electrode, are generally about several hours, respectively. When a longer operation time is required, a plurality of pressure control apparatus 12a and 12b are connected in parallel.

As described above, by turning ON both pressure control apparatus 11a and 11b, as long as the flow rate of the gas supplied to the pressure control apparatus is less than the flow rate by which the gas can be exhausted in the pressure control apparatus, even if the gas is continuously introduced from the CBr$_4$ gas bomb to the gas branch piping apparatus, the gas flow in the both A and B directions can be interrupted.

(2) In a case where the A direction flow is interrupted and the gas flows in the B direction:

Initially, the flow rate of the gas which is supplied to the pressure control apparatus 11a, i.e., the flow rate of the gas flowing into the A direction, is a flow rate at which the gas can be exhausted in the pressure control apparatus 11a by the regulator 14a. When the power supply of the pressure control apparatus 11a is turned ON, the whole quantity of the CBr$_4$ gas flowing in the A direction is exhausted in the pressure control part 12a of the pressure control apparatus 11a. That is, the A direction flow is interrupted. On the other hand, the gas flowing in the B direction is not exhausted by turning OFF the power supply of the pressure control apparatus 11b, whereby the gas flows in the B direction as it is.

As described above, by turning ON the pressure control apparatus 11a and turning OFF the pressure control apparatus 11b, even though the gas is continuously introduced from the CBr$_4$ bomb to the gas branch piping apparatus, the gas flows in the B direction while the A direction flow is interrupted.

In addition, by adjusting the exhaust capacity of the pressure control apparatus 11b and operating the apparatus, and exhausting a desired quantity of the gas flowing in the B direction in the pressure control apparatus 11b, the flow rate of the gas flowing in the B direction can be quickly and accurately controlled.

(3) In a case where the gas flows in the A direction and the B direction flow is interrupted:

By reversing only A direction and B direction in the case (2), the same operation as described above is obtained.

(4) In a case where the gas flows into both the A and B directions:

When the power supplies of the pressure control apparatus 11a and 11b are turned OFF, the exhaust function is not conducted in either apparatus, whereby the introduced CBr$_4$ gas can flow in both the A and B directions.

In addition, by adjusting each exhaust capacity of the pressure control apparatus 11a and 11b and operating the apparatus, the flow rates of the gas flowing in the A direction and B direction can be quickly and accurately controlled, respectively.

In the gas branch piping apparatus according to the seventh embodiment, since the pressure control apparatus 11a and 11b are used as gas branching means, the gas flow direction and the flow rate of the gas are quickly and accurately controlled. Further, the pressure control apparatus 11a and 11b require no mechanical operation and have a high durability, whereby the gas branch piping apparatus according to the seventh embodiment is specially effective when it is necessary to vary the gas flow direction quite often.

What is claimed is:

1. An MBE apparatus for growing crystals by molecular beam epitaxy comprising:

a reaction chamber in which a molecular beam of a gas irradiates a substrate for crystal growth on the substrate;

a gas bomb for containing the gas;

a regulator connected between the reaction chamber and the gas bomb for reducing the pressure of the gas flowing from the gas bomb;

a pressure control apparatus having at least one anode electrode and at least one cathode electrode for applying an electric field to gas supplied to the reaction chamber, a coil for generating a magnetic field applied to the supplied gas, and a controller for controlling the electric field between the anode electrode and the cathode electrode, the magnetic field generated by the coil, and the pressure of the gas supplied from the regulator to the pressure control apparatus; and a molecular beam cell located in the reaction chamber for converting the gas supplied from the pressure control apparatus to the reaction chamber to a molecular beam for irradiating the substrate.

2. The MBE apparatus of claim 1 wherein the molecular beam cell includes a nozzle and is directly connected to the regulator, and the pressure control apparatus is connected to the nozzle of the molecular beam cell.

3. The MBE apparatus of claim 1 including a plurality of pressure control apparatus connected in series.

4. An MBE apparatus for growing crystals by molecular beam epitaxy comprising:

a reaction chamber in which a molecular beam of a gas irradiates a plurality of substrates for crystal growth on the substrates;

a gas bomb for containing the gas;

a regulator connected between the reaction chamber and the gas bomb for reducing the pressure of the gas flowing from the gas bomb;

a plurality of pressure control apparatus arranged in parallel and each having at least one anode electrode and at least one cathode electrode for applying an electric field to gas supplied to the reaction chamber, a coil for generating a magnetic field applied to the supplied gas, and a controller for controlling the electric field between the anode electrode and the cathode electrode, the magnetic field generated by the coil, and the pressure of the gas supplied from the regulator to each pressure control apparatus; and a plurality of molecular beam cells located in the reaction chamber for converting the gas supplied from the respective pressure control apparatus to the reaction chamber to a molecular beam for irradiating the substrates, respectively.

5. The MBE apparatus of claim 1 including a plurality of molecular beam cells having nozzles and directly connected to the regulator, in parallel with each other, each pressure control apparatus being connected to the nozzle of a corresponding molecular beam cell.

6. The MBE apparatus of claim 5 including a plurality of pressure control apparatus arranged in series with each other.

7. The MBE apparatus of claim 1 including a plurality of pressure control apparatus arranged in parallel with each other.

8. A gas branch piping apparatus including a plurality of branch pipes connected to a main pipe and a plurality of pressure control apparatus, each pressure control apparatus having an anode electrode and a cathode electrode for applying an electric field to gas flowing through a branch pipe, a coil for generating a magnetic field applied to the gas flowing through a branch pipe, and a controller for controlling the electric field between the anode electrode and the cathode electrode, areas of the anode electrode and the cathode electrode, and the magnetic field generated by the coil of each pressure control apparatus, the pressure control apparatus being respectively located at each of the plurality of branch pipes.

* * * * *